(12) United States Patent
Tu et al.

(10) Patent No.: US 11,004,796 B2
(45) Date of Patent: May 11, 2021

(54) INTEGRATED FAN-OUT PACKAGE

(71) Applicant: Taiwan Semiconductor Manufacturing Co., Ltd., Hsinchu (TW)

(72) Inventors: Meng-Che Tu, Hsinchu (TW); Hung-Jui Kuo, Hsinchu (TW); Yu-Hsiang Hu, Hsinchu (TW); Sih-Hao Liao, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/513,729

(22) Filed: Jul. 17, 2019

(65) Prior Publication Data
US 2021/0020575 A1    Jan. 21, 2021

(51) Int. Cl.
*H01L 23/538* (2006.01)
*H01L 23/00* (2006.01)
*H01L 25/065* (2006.01)
*H01L 23/28* (2006.01)
*H01Q 1/22* (2006.01)

(52) U.S. Cl.
CPC .......... *H01L 23/5384* (2013.01); *H01L 23/28* (2013.01); *H01L 23/5386* (2013.01); *H01L 24/94* (2013.01); *H01L 25/0657* (2013.01); *H01Q 1/2283* (2013.01)

(58) Field of Classification Search
CPC . H01L 23/5384; H01L 23/5386; H01L 23/28; H01L 24/94; H01L 25/0657
USPC ........ 257/774, 741, 738, 690, 428, E23.069, 257/E23.169, E21.499; 343/700 MS, 770, 343/834, 836, 895; 438/108, 121, 613, 438/667, 381
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |

(Continued)

*Primary Examiner* — Dao H Nguyen
(74) *Attorney, Agent, or Firm* — JCIPRNET

(57) ABSTRACT

An integrated fan-out (InFO) package includes a first redistribution structure, a die, an encapsulant, a plurality of through insulating vias (TIV), a plurality of dipole antennas, and a second redistribution structure. The die is disposed on the first redistribution structure. The encapsulant encapsulates the die. The TIVs and the dipole antennas are embedded in the encapsulant. Each dipole antenna includes a pair of antenna elements. Each antenna element has a first folded-sidewall and a second folded-sidewall opposite to the first folded-sidewall. A portion of each second folded-sidewall in the pair of antenna elements face each other. Each first folded-sidewall includes at least three sub-sidewalls connected to each other. The adjacent sub-sidewalls form an obtuse angle. The second redistribution structure is disposed on the die, the TIVs, the dipole antennas, and the encapsulant.

20 Claims, 12 Drawing Sheets

(56) References Cited

U.S. PATENT DOCUMENTS

| | | | |
|---|---|---|---|
| 10,763,217 B2* | 9/2020 | Lee | H01L 23/5226 |
| 2011/0095948 A1* | 4/2011 | Alexopoulos | H01Q 1/38 |
| | | | 343/700 MS |
| 2017/0346185 A1* | 11/2017 | Wang | H01Q 1/2283 |
| 2018/0158787 A1* | 6/2018 | Chang | H01L 23/552 |
| 2019/0348747 A1* | 11/2019 | Liu | H01Q 1/2283 |
| 2020/0013735 A1* | 1/2020 | Liu | H01Q 9/0407 |
| 2020/0083591 A1* | 3/2020 | Hsieh | H01Q 1/2283 |
| 2020/0335458 A1* | 10/2020 | Chen | H01L 21/4853 |

* cited by examiner

INTEGRATED FAN-OUT PACKAGE

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
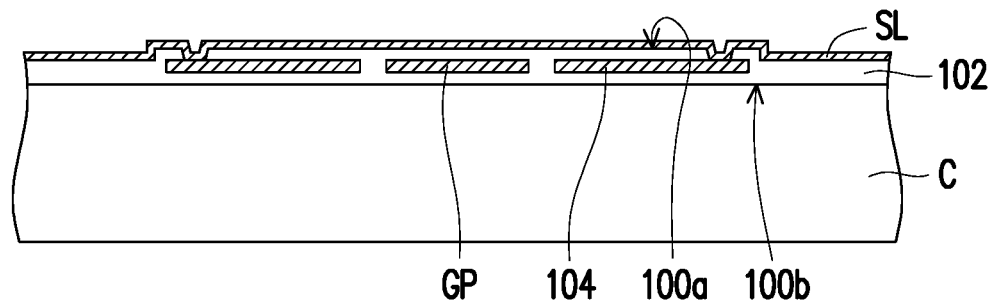
FIG. 1A to FIG. 1L are schematic cross-sectional views illustrating a manufacturing process of an integrated fan-out (InFO) package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1L are schematic cross-sectional views illustrating a manufacturing process of an integrated fan-out (InFO) package 10 in accordance with some embodiments of the disclosure. Referring to FIG. 1A, a carrier C is provided. In some embodiments, the carrier C is a glass substrate. Subsequently, a first redistribution structure 100 is formed over the carrier C. In some embodiments, the first redistribution structure 100 includes a first dielectric layer 102, a ground plane GP, and plurality of first conductive patterns 104. The first redistribution structure 100 has a first surface 100a and a second surface 100b opposite to the first surface 100a. At this stage, the first surface 100a faces upward while the second surface 100b faces the carrier C. In some embodiments, a de-bonding layer (not shown) may be provided between the first dielectric layer 102 and the carrier C. The de-bonding layer may be a light-to-heat conversion (LTHC) release layer and may aid the removal of the carrier C in the subsequent processes. In some embodiments, the first redistribution structure 100 may be referred to as a backside redistribution structure.

In some embodiments, the first dielectric layer 102 may be a polymer layer made of polybenzoxazole (PBO), polyimide (PI), benzocyclobutene (BCB), a combination thereof, or the like. In some embodiments, the first dielectric layer 102 may include multiple dielectric layers. For example, the first redistribution structure 100 may be configured such that the ground plane GP and the first conductive patterns 104 are sandwiched between two adjacent dielectric layers of the first dielectric layer 102. That is, the ground plane GP and the first conductive patterns 104 may be considered as being embedded in the first dielectric layer 102. In some embodiments, the ground plane GP may be electrically connected to a ground. On the other hand, the first conductive patterns 104 may be electrically connected to other subsequently formed conductive elements for signal transmission. The ground plane GP and the first conductive patterns 104 may be formed by a same photolithography and etching process at the same time. In other words, in some embodiments, the ground plane GP and the first conductive patterns 104 may be collectively referred to as a first conductive pattern layer. In some embodiments, the ground plane GP and the first conductive patterns 104 includes copper, nickel, titanium, a combination thereof, or the like. It should be noted that the number of the dielectric layers (the first dielectric layer 102) and/or the first conductive pattern layer (i.e. the ground plane GP and the first conductive patterns 104) is not limited by the illustration presented in FIG. 1A. In some alternative embodiments, more dielectric layers and/or more conductive pattern layers may be formed to stack alternately.

As illustrated in FIG. 1A, the first dielectric layer 102 is patterned to form a plurality of openings exposing at least a portion of the first conductive patterns 104. A seed material layer SL is conformally formed on the first surface 100a of the first redistribution structure 100. For example, the seed material layer SL is formed on the first dielectric layer 102 and the first conductive patterns 104 exposed by the openings. In some embodiments, the seed material layer SL includes a titanium/copper composite layer and is formed by a sputtering process.

Figure 1B:
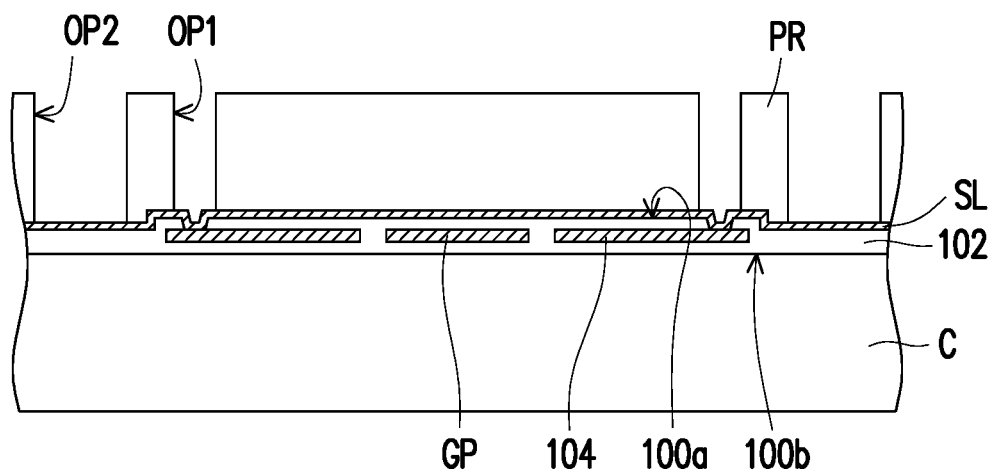
Figure 2:
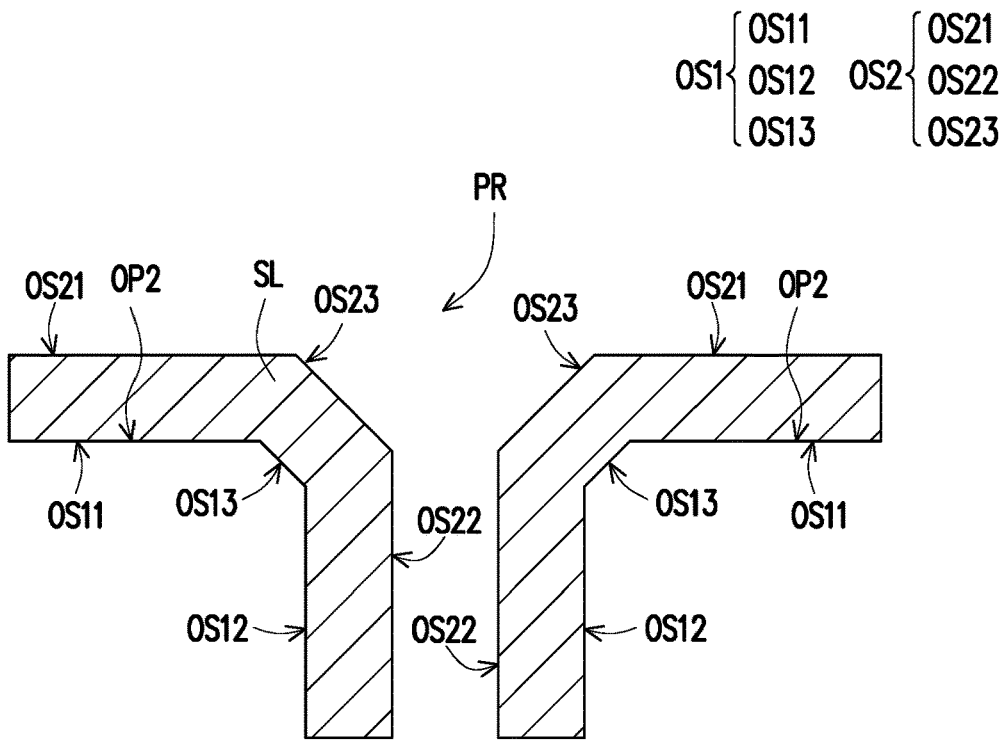
FIG. 2 is a schematic top view illustrating an intermediate stage of the manufacturing process of the InFO package in FIG. 1B.

Referring to FIG. 1B, a photoresist layer PR is formed on the seed material layer SL. In some embodiments, the photoresist layer PR has a plurality of first openings OP1 and a plurality of second openings OP2. The first openings OP1 and the second openings OP2 expose the underlying seed material layer SL. In some embodiments, the first openings OP1 and the second openings OP2 are formed through a photolithography process. In some embodiments, each first openings OP1 is formed to have a circular shape from a top view. However, the disclosure is not limited thereto. In some alternative embodiments, each first opening OP1 may exhibit a polygonal shape from the top view. On the other hand, the second openings OP2 are formed to have a shape illustrated in FIG. 2. FIG. 2 is a schematic top view illustrating an intermediate stage of the manufacturing process of the InFO package 10 in FIG. 1B. Referring to FIG. 2, each second opening OP2 exhibits a shape similar to letter "J" from the top view. In some embodiments, two adjacent second openings OP2 are formed in a back-to-back manner. For example, the legs of the adjacent letter "J" extend away from each other. In some embodiments, the two adjacent second openings OP2 are mirror image of each other. In some embodiments, each second opening OP2 has a first opening sidewall OS1 and a second opening sidewall OS2 opposite to the first opening sidewall OS1. In some embodiments, the first opening sidewall OS1 is constituted by a first sub-sidewall OS11, a second sub-sidewall OS12, and a third sub-sidewall OS13. In some embodiments, the third sub-sidewall OS13 connects the first sub-sidewall OS11 and the second sub-sidewall OS12. Similarly, the second opening sidewall OS2 is constituted by a first sub-sidewall OS21, a second sub-sidewall OS22, and a third sub-sidewall OS23. In some embodiments, the third sub-sidewall OS23 connects the first sub-sidewall OS21 and the second sub-sidewall OS22.

As mentioned above, the second openings OP2 are formed through a photolithography process. As illustrated in FIG. 2, since the corner of each second opening OP2 is not sharp and is occupied by the third sub-sidewall OS13, the profile of the second opening OP2 is able to precisely reflect the desired pattern during the photolithography process and the undercut of the photoresist layer PR may be sufficiently eliminated. For example, during the developing process of the photoresist layer PR, the non-sharp corner of the second openings OP2 aids the precise development of the photoresist layer PR, thereby allowing the pattern on a mask to be accurately transferred onto the photoresist layer PR. As a result, high precision second openings OP2 may be formed. It is noted that the term "sharp" refers to angles of 90° or less throughout the entire disclosure. On the other hand, the term "sharp corner" refers to corners having angles of 90° or less throughout the entire disclosure.

Figure 1C:
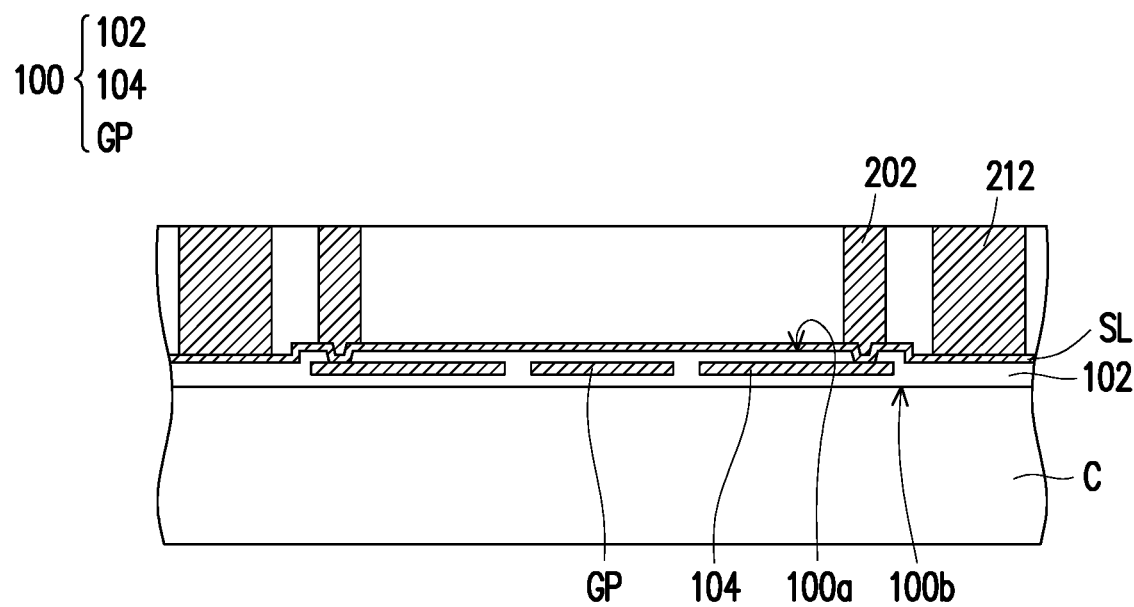

Referring to FIG. 1C, a first conductive material layer 202 is formed on the seed material layer SL and in the first openings OP1. Similarly, a second conductive material layer 212 is formed on the seed material layer SL and in the second openings OP2. In some embodiments, a material of the first conductive material layer 202 and a material of the second conductive material layer 212 may be the same or different. In some embodiments, the material of the first conductive material layer 202 and the material of the second conductive material layer 212 include aluminum, titanium, copper, nickel, tungsten, and/or alloys thereof. In some embodiments, the first conductive material layer 202 and the second conductive material layer 212 may be formed through electro-plating, electroless-plating, immersion plating, or the like.

Figure 1D:
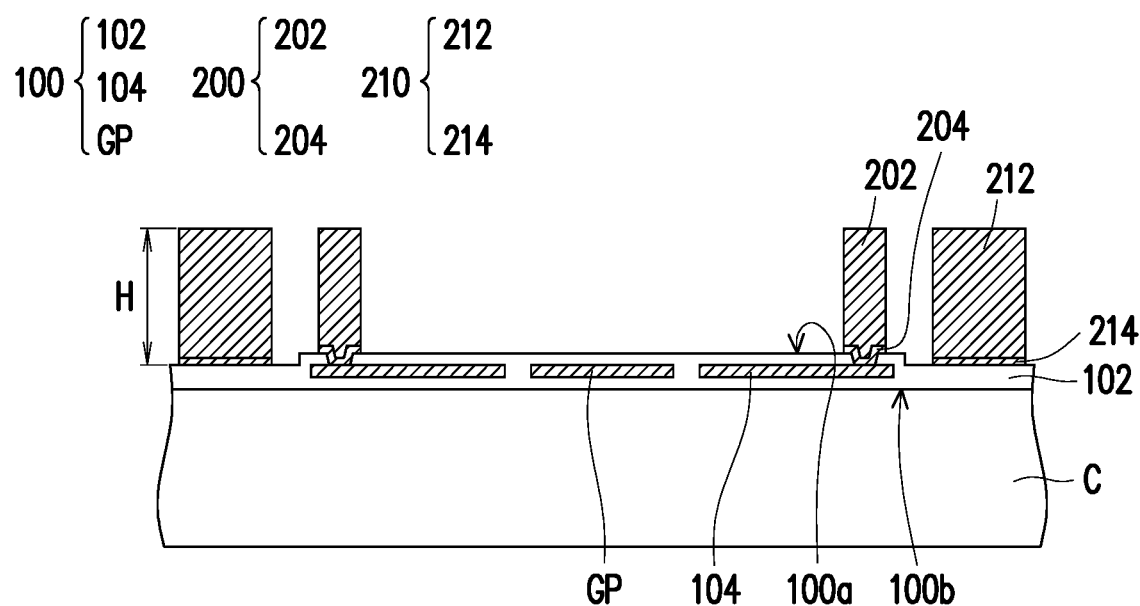

Referring to FIG. 1C and FIG. 1D, the photoresist layer PR is removed. As mentioned above, each second opening OP2 has non-sharp corners. As such, the photoresist layer PR at the corner region may be sufficiently removed without the presence of residue. Subsequently, the seed material layer SL exposed by the first conductive material layer 202 and the second conductive material layer 212 are removed to form a plurality of first seed layer patterns 204 and a plurality of second seed layer patterns 214. In some embodiments, since the photoresist layer PR is being removed sufficiently, the first conductive material layer 202 and the second conductive material layer 212 may serve as a mask for partially removing the seed material layer SL. As a result, a contour of the first seed layer patterns 204 is identical to the contour of the first conductive material layer 202. Similarly, a contour of the second seed layer patterns 214 is identical to the contour of the second conductive material layer 212. Since the contours of the first seed layer patterns 204 and the second seed layer patterns 214 are respectively identical to the contours of the first conductive material layer 202 and the second conductive material layer 212, the electrical leakage problem caused by mismatch in shapes of the seed layer pattern and conductive material layer may be effectively eliminated, thereby ensuring the performance of the subsequently formed InFO package 10.

In some embodiments, the first seed layer patterns 204 and the first conductive material layer 202 are collectively referred to as through insulating vias (TIV) 200. On the other hand, the second seed layer patterns 214 and the second conductive material layer 212 are collectively referred to as antenna elements 210. In some embodiments, a shape of TIVs 200 is identical to the shape of the first openings OP1. Similarly, a shape of the antenna elements 210 is identical to the shape of the second openings OP2. In some embodiments, the antenna elements 210 have substantially straight sidewalls. As illustrated in FIG. 1D, the TIVs 200 are electrically connected to the first conductive patterns 104 and the antenna elements 210 are electrically insulated from the first conductive patterns 104 and the ground plane GP. In some embodiments, a height H of the antenna elements 210 ranges between 100 μm and 300 μm. In some embodiments, the antenna elements 210 are arranged to form a plurality of dipole antennas. The configuration of the dipole antennas will be discussed below in conjunction with FIG. 3A.

Figure 3A:
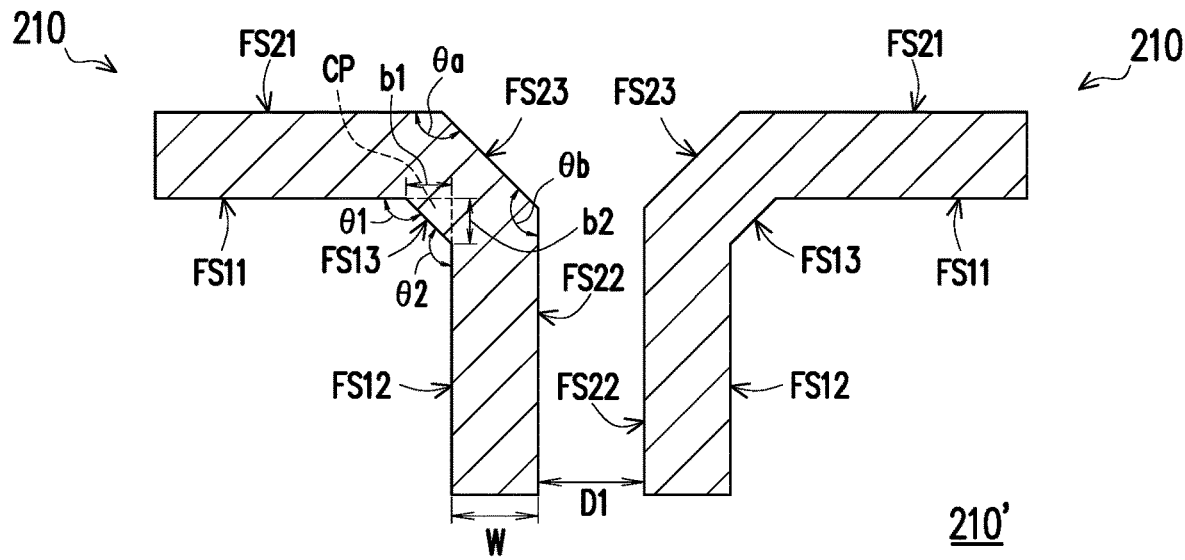
FIG. 3A is a schematic top view illustrating a dipole antenna in accordance with some embodiments of the disclosure.

FIG. 3A is a schematic top view illustrating a dipole antenna 210' in accordance with some embodiments of the disclosure. Referring to FIG. 3A, the dipole antenna 210' includes a pair of two adjacent antenna elements 210. In some embodiments, the pair of two adjacent antenna elements 210 are mirror image of each other. In some embodiments, a width W of each antenna element 210 ranges between 100 µm and 300 µm. In other words, the aspect ratio (height to width) of each antenna element 210 ranges between 0.33 and 3.0.

In some embodiments, each antenna element 210 has a first folded-sidewall FS1 and a second folded-sidewall FS2 opposite to the first folded-sidewall FS1. In some embodiments, the first folded-sidewall FS1 includes a first sub-sidewall FS11, a second sub-sidewall FS12, and a third sub-sidewall FS13. In some embodiments, the third sub-sidewall FS13 connects the first sub-sidewall FS11 and the second sub-sidewall FS12. Similarly, the second folded-sidewall FS2 includes a first sub-sidewall FS21, a second sub-sidewall FS22, and a third sub-sidewall FS23. In some embodiments, the third sub-sidewall FS23 connects the first sub-sidewall FS21 and the second sub-sidewall FS22. As illustrated in FIG. 3A, a portion of each second folded-sidewall FS2 in the pair of antenna elements 210 face each other. For example, the second sub-sidewall FS22 of one antenna element 210 faces the second sub-sidewall FS22 of the adjacent antenna element 210. In some embodiments, a distance D1 between two adjacent antenna elements 210 ranges between 100 µm and 300 µm.

In some embodiments, the adjacent sub-sidewalls of the first folded-sidewall FS1 form an obtuse angle. For example, an included angle θ1 between the first sub-sidewall FS11 and the third sub-sidewall FS13 is an obtuse angle. Similarly, an included angle θ2 between the third sub-sidewall FS13 and the second sub-sidewall FS12 is an obtuse angle. In some embodiments, the adjacent sub-sidewalls of the second folded-sidewall FS2 may arrange in a similar manner. That is, the adjacent sub-sidewalls of the second folded-sidewall FS2 form an obtuse angle. For example, an included angle θa between the first sub-sidewall FS21 and the third sub-sidewall FS23 is an obtuse angle. Similarly, an included angle θb between the third sub-sidewall FS23 and the second sub-sidewall FS22 is an obtuse angle. In some embodiments, the included angle θ1, the included angle θ2, the included angle θa, and the included angle θb are greater than 90° and less than 180°. In some embodiments, the included angle θ1, the included angle θ2, the included angle θa, and the included angle θb may be the same or different. In some embodiments, two sub-sidewalls of the first folded-sidewall FS1 farthest away from each other are perpendicular. For example, the first sub-sidewall FS11 and the second sub-sidewall FS12 are perpendicular. In some embodiments, two sub-sidewalls of the second folded-sidewall FS2 farthest away from each other are perpendicular. For example, the first sub-sidewall FS21 and the second sub-sidewall FS22 are perpendicular.

In some embodiments, each antenna element 210 has a corner portion CP. As illustrated in FIG. 3A, the corner portion CP is enclosed by the third sub-sidewall FS13, a virtual plane extending along the first sub-sidewall FS11, and a virtual plane extending along the second sub-sidewall FS12. In some embodiments, a length b1 of a side of the corner portion CP ranges between 100 µm and 200 µm. On the other hand, a length b2 of another side of the corner portion CP ranges between 100 µm and 200 µm. In some embodiments, a ratio of an area of the corner portion CP to an area of the entire antenna element 210 ranges between 5% and 50%.

Although FIG. 3A illustrated that the first folded-sidewall FS1 and the second folded-sidewall FS2 respectively includes three sub-sidewalls, the disclosure is not limited thereto. In some alternative embodiments, the first folded-sidewall FS1 and the second folded-sidewall FS2 may respectively include more than three sub-sidewalls. As illustrated in FIG. 3A, the corner portion CP is triangular from the top view. However, the disclosure is not limited thereto. Depending on the number of the sub-sidewalls in the first folded-sidewall FS1, the corner portion CP may take other shapes from the top view. Other configurations of the dipole antenna will be discussed below in conjunction with FIG. 3B to FIG. 3F.

Figure 3B:
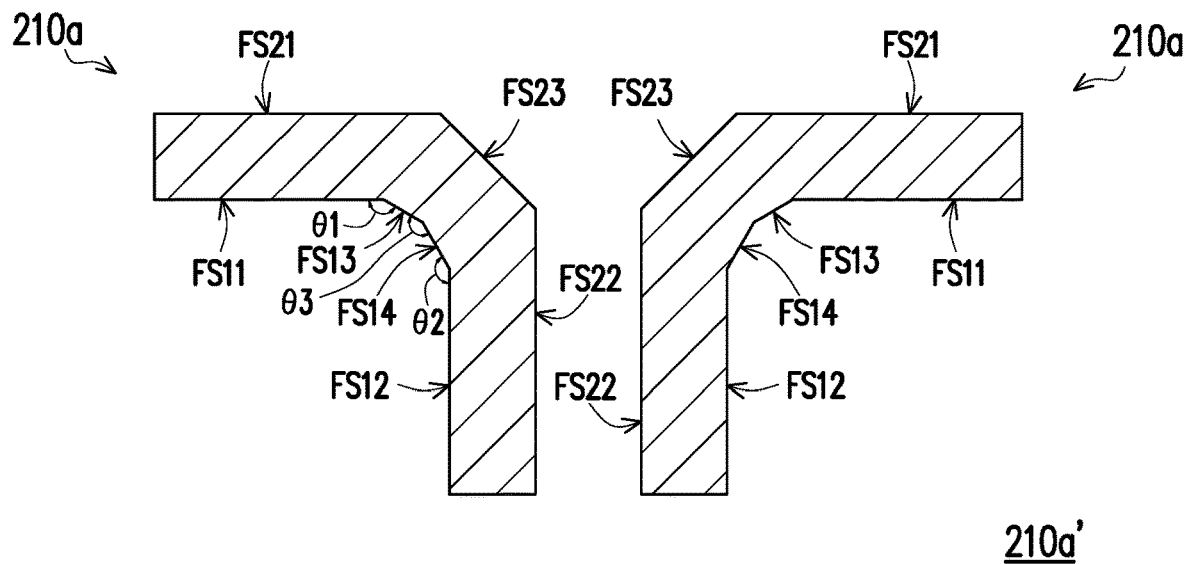
FIG. 3B is a schematic top view illustrating a dipole antenna in accordance with some alternative embodiments of the disclosure.

FIG. 3B is a schematic top view illustrating a dipole antenna 210a' in accordance with some alternative embodiments of the disclosure. Referring to FIG. 3B, the dipole antenna 210a' includes a pair of two adjacent antenna elements 210a. The antenna elements 210a in FIG. 3B are similar to the antenna elements 210 in FIG. 3A, so similar components are denoted by the same reference numeral, and the detailed descriptions thereof are omitted herein. The difference between the antenna elements 210a in FIG. 3B and the antenna elements 210 in FIG. 3A lies in that the first folded-sidewall FS1 of the antenna elements 210a has four sub-sidewalls. As illustrated in FIG. 3B, the first folded-sidewall FS1 includes a first sub-sidewall FS11, a second sub-sidewall FS12, a third sub-sidewall FS13, and a fourth sub-sidewall FS14. In some embodiments, the third sub-sidewall FS13 connects the first sub-sidewall FS11 and the fourth sub-sidewall FS14. On the other hand, the fourth sub-sidewall FS14 connects the third sub-sidewall FS13 and the second sub-sidewall FS12.

In some embodiments, the adjacent sub-sidewalls of the first folded-sidewall FS1 form an obtuse angle. For example, an included angle θ1 between the first sub-sidewall FS11 and the third sub-sidewall FS13 is an obtuse angle. Similarly, an included angle θ2 between the fourth sub-sidewall FS14 and the second sub-sidewall FS12 is an obtuse angle. Furthermore, an included angle θ3 between the third sub-sidewall FS13 and the fourth sub-sidewall FS14 is an obtuse angle. In some embodiments, the included angle θ1, the included angle θ2, and the included angle θ3 are greater than 90° and less than 180°. In some embodiments, the included angle θ1, the included angle θ2, and the included angle θ3 may be the same or different. In some embodiments, two sub-sidewalls of the first folded-sidewall FS1 farthest away from each other are perpendicular. For example, the first sub-sidewall FS11 and the second sub-sidewall FS12 are perpendicular.

Figure 3C:
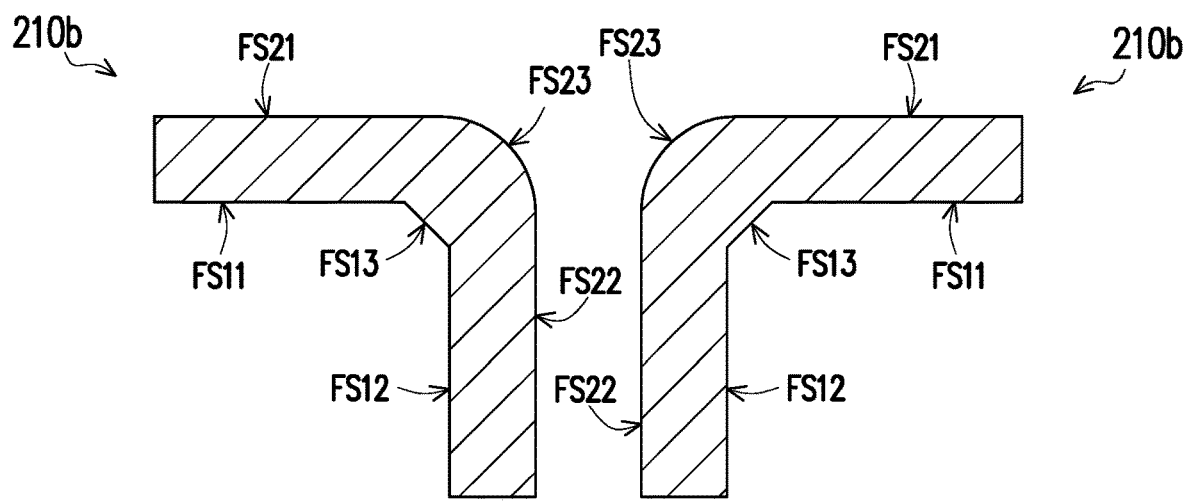
FIG. 3C is a schematic top view illustrating a dipole antenna in accordance with some alternative embodiments of the disclosure.

FIG. 3C is a schematic top view illustrating a dipole antenna 210b' in accordance with some alternative embodiments of the disclosure. Referring to FIG. 3C, the dipole antenna 210b' includes a pair of two adjacent antenna elements 210b. The antenna elements 210b in FIG. 3C are similar to the antenna elements 210 in FIG. 3A, so similar components are denoted by the same reference numeral, and the detailed descriptions thereof are omitted herein. The difference between the antenna elements 210b in FIG. 3C and the antenna elements 210 in FIG. 3A lies in that the third sub-sidewall FS23 of the second folded-sidewall FS2 is a curved sidewall. For example, when the number of the sub-sidewalls of the second folded-sidewall FS2 is infinite, the sub-sidewalls connecting the first sub-sidewall FS21 and the second sub-sidewall FS22 may be collectively referred to as the third sub-sidewall FS23, in which the third sub-sidewall FS23 exhibits a curved surface. In some embodiments, an arc of the third sub-sidewall FS23 ranges between 0.1 radian and 1.57 radian.

Figure 3D:
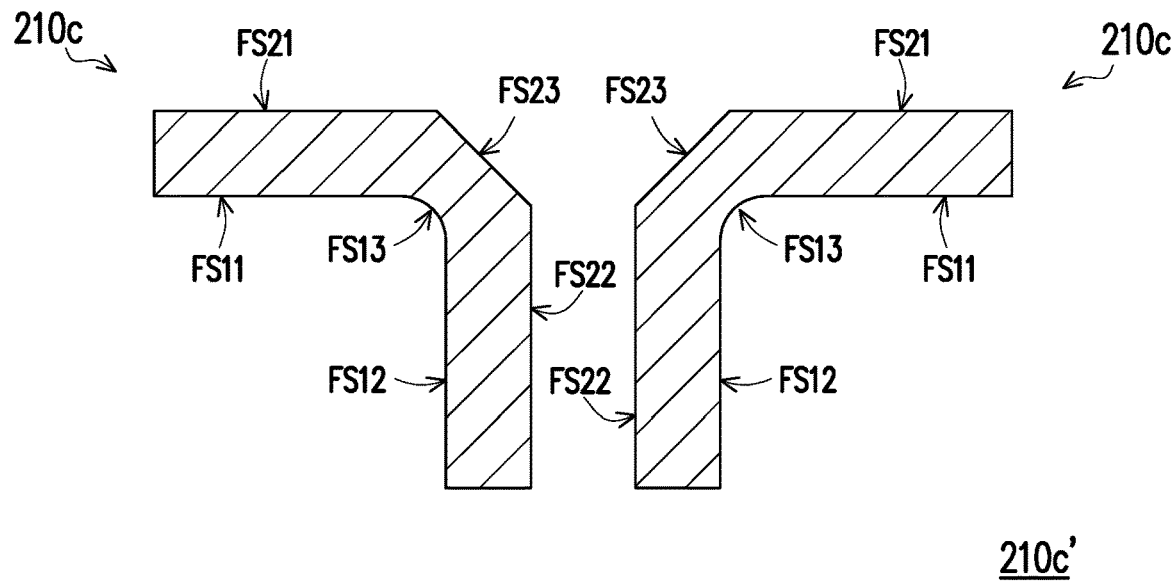
FIG. 3D is a schematic top view illustrating a dipole antenna in accordance with some alternative embodiments of the disclosure.

FIG. 3D is a schematic top view illustrating a dipole antenna 210c' in accordance with some alternative embodiments of the disclosure. Referring to FIG. 3D, the dipole antenna 210c' includes a pair of two adjacent antenna elements 210c. The antenna elements 210c in FIG. 3D are similar to the antenna elements 210 in FIG. 3A, so similar components are denoted by the same reference numeral, and the detailed descriptions thereof are omitted herein. The difference between the antenna elements 210c in FIG. 3D and the antenna elements 210 in FIG. 3A lies in that the third sub-sidewall FS13 of the first folded-sidewall FS1 is a curved sidewall. For example, when the number of the sub-sidewalls of the first folded-sidewall FS1 is infinite, the sub-sidewalls connecting the first sub-sidewall FS11 and the second sub-sidewall FS12 may be collectively referred to as the third sub-sidewall FS13, in which the third sub-sidewall FS13 exhibits a curved surface. In some embodiments, an arc of the third sub-sidewall FS13 ranges between 0.1 radian and 1.57 radian.

Figure 3E:
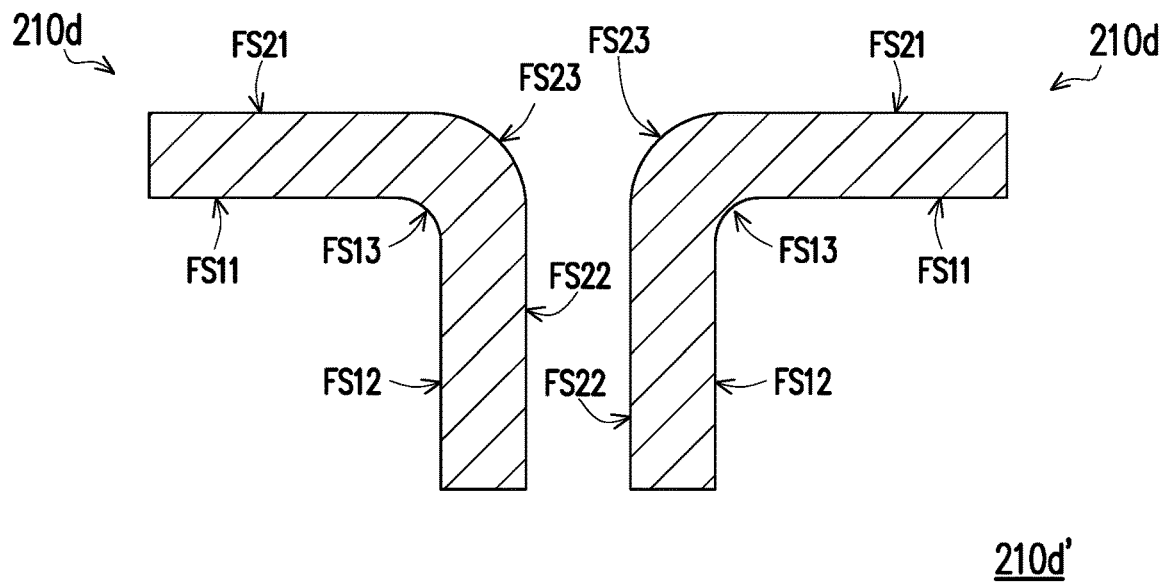
FIG. 3E is a schematic top view illustrating a dipole antenna in accordance with some alternative embodiments of the disclosure.

FIG. 3E is a schematic top view illustrating a dipole antenna 210d' in accordance with some alternative embodiments of the disclosure. Referring to FIG. 3E, the dipole antenna 210d' includes a pair of two adjacent antenna elements 210d. The antenna elements 210d in FIG. 3E are similar to the antenna elements 210 in FIG. 3A, so similar components are denoted by the same reference numeral, and the detailed descriptions thereof are omitted herein. The difference between the antenna elements 210d in FIG. 3E and the antenna elements 210 in FIG. 3A lies in that the third sub-sidewall FS13 of the first folded-sidewall FS1 and the third sub-sidewall FS23 of the second folded-sidewall FS2 are curved sidewalls. For example, when the number of the sub-sidewalls of the first folded-sidewall FS1 is infinite, the sub-sidewalls connecting the first sub-sidewall FS11 and the second sub-sidewall FS12 may be collectively referred to as the third sub-sidewall FS13, in which the third sub-sidewall FS13 exhibits a curved surface. Similarly, when the number of the sub-sidewalls of the second folded-sidewall FS2 is infinite, the sub-sidewalls connecting the first sub-sidewall FS21 and the second sub-sidewall FS22 may be collectively referred to as the third sub-sidewall FS23, in which the third sub-sidewall FS23 exhibits a curved surface. In some embodiments, an arc of the third sub-sidewall FS13 of the first folded-sidewall FS1 ranges between 0.1 radian and 1.57 radian and an arc of the third sub-sidewall FS23 of the second folded-sidewall FS2 ranges between 0.1 radian and 1.57 radian.

Figure 3F:
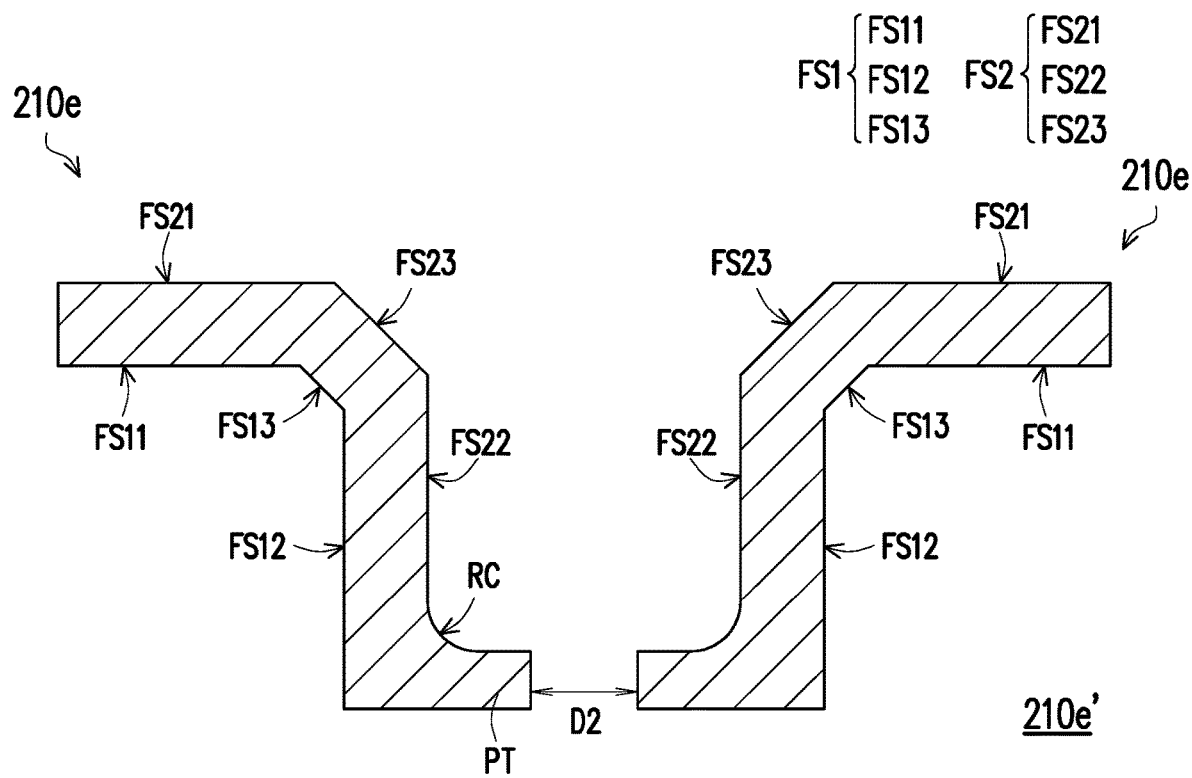
FIG. 3F is a schematic top view illustrating a dipole antenna in accordance with some alternative embodiments of the disclosure.

FIG. 3F is a schematic top view illustrating a dipole antenna 210e' in accordance with some alternative embodiments of the disclosure. Referring to FIG. 3F, the dipole antenna 210e' includes a pair of two adjacent antenna elements 210e. The antenna elements 210e in FIG. 3F are similar to the antenna elements 210 in FIG. 3A, so similar components are denoted by the same reference numeral, and the detailed descriptions thereof are omitted herein. The difference between the antenna elements 210e in FIG. 3F and the antenna elements 210 in FIG. 3A lies in that each of the antenna elements 210e further includes a protrusion PT and a rounded corner RC. In some embodiments, the protrusion PT protrudes from the second folded-sidewall FS2 and the rounded corner RC connects the second folded-sidewall FS2 and the protrusion PT. In some embodiments, an arc of the rounded corner RC ranges between 0.1 radian and 1.57 radian. In some embodiments, the protrusions PT of the pair of two adjacent antenna elements 210e extend toward each other. In some embodiments, a distance D2 between the protrusions PT of the pair of antenna elements 210e ranges between 60 μm and 200 μm.

Since the dipole antennas 210', 210a', 210b', 210c', 210d', and 210e' in FIG. 3A to FIG. 3F are free of sharp corners, the photoresist layer PR (shown in FIG. 1B and FIG. 2) may be effectively removed during the photolithography process for forming these dipole antenna. As a result, the negative effects originated from undercut of the photoresist layer PR may be sufficiently eliminated, thereby ensuring the performance of the subsequently formed device.

Referring back to FIG. 1E, a die 300 (or integrated circuit components) may be picked and placed onto the first surface 100a of the first redistribution structure 100. The die 300, for example, includes a semiconductor substrate 310, a plurality of conductive pads 320, a passivation layer 330, a post-passivation layer 340, a plurality of conductive vias 350, and a protection layer 360. In some embodiments, the conductive pads 320 are disposed over the semiconductor substrate 310. The passivation layer 330 is formed over the semiconductor substrate 310 and has contact openings that partially expose the conductive pads 320. The semiconductor substrate 310 may be a silicon substrate including active components (e.g., transistors or the like) and passive components (e.g., resistors, capacitors, inductors or the like) formed therein. The conductive pads 320 may be aluminum pads, copper pads, or other suitable metal pads. The passivation layer 330 may be a silicon oxide layer, a silicon nitride layer, a silicon oxy-nitride layer, or a dielectric layer formed by other suitable dielectric materials. Furthermore, the post-passivation layer 340 is formed over the passivation layer 330. The post-passivation layer 340 covers the passivation layer 330 and has a plurality of contact openings. The conductive pads 320 are partially exposed by the contact openings of the post passivation layer 340. The post-passivation layer 340 may be a PI layer, a PBO layer, or a dielectric layer formed by other suitable polymers. In addition, the conductive vias 350 are formed on the conductive pads 320. In some embodiments, the conductive vias 350 are plated on the conductive pads 320. The protection layer 360 is formed on the post-passivation layer 340 so as to cover the conductive vias 350.

Figure 1E:
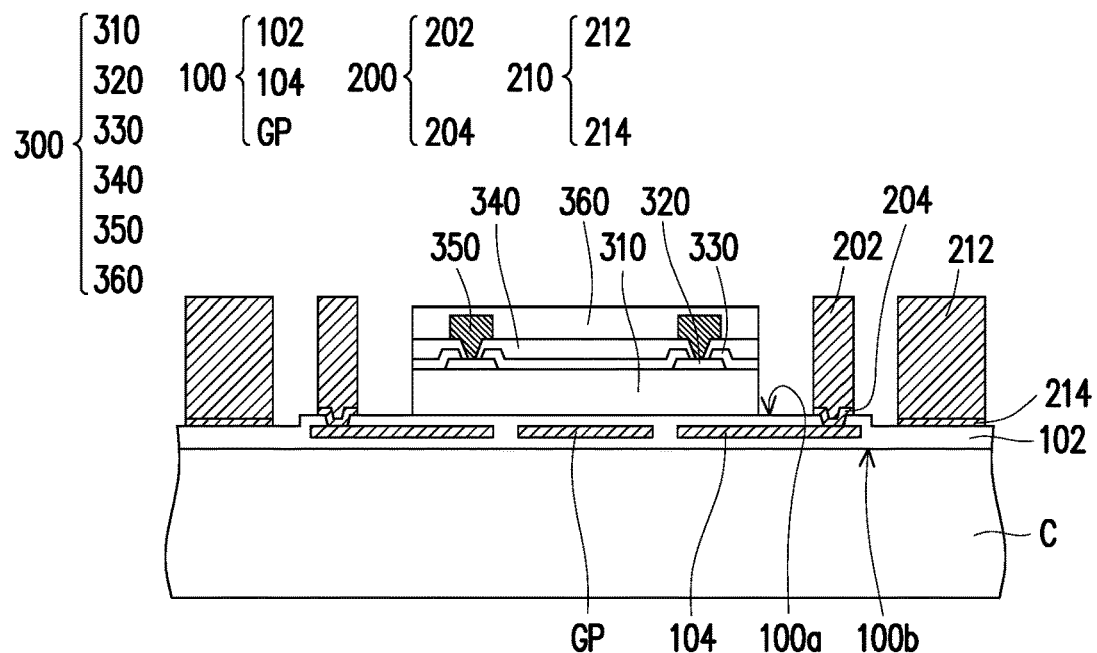

In some embodiments, the die 300 is attached (or adhered) to the first dielectric layer 102 through a die attach film (DAF; not shown). In some embodiments, one or more die(s) 300 may be picked and placed onto the first dielectric layer 102 after the formation of the TIVs 200 and/or the antenna elements 210. However, the disclosure is not limited thereto. In some alternative embodiments, one or more die(s) 300 may be picked and placed onto the first dielectric layer 102 prior to the formation of the TIVs 200 and/or the antenna elements 210. As illustrated in FIG. 1E, the TIVs 200 are arranged between the die 300 and the antenna elements 210 (dipole antennas 210').

Figure 1F:
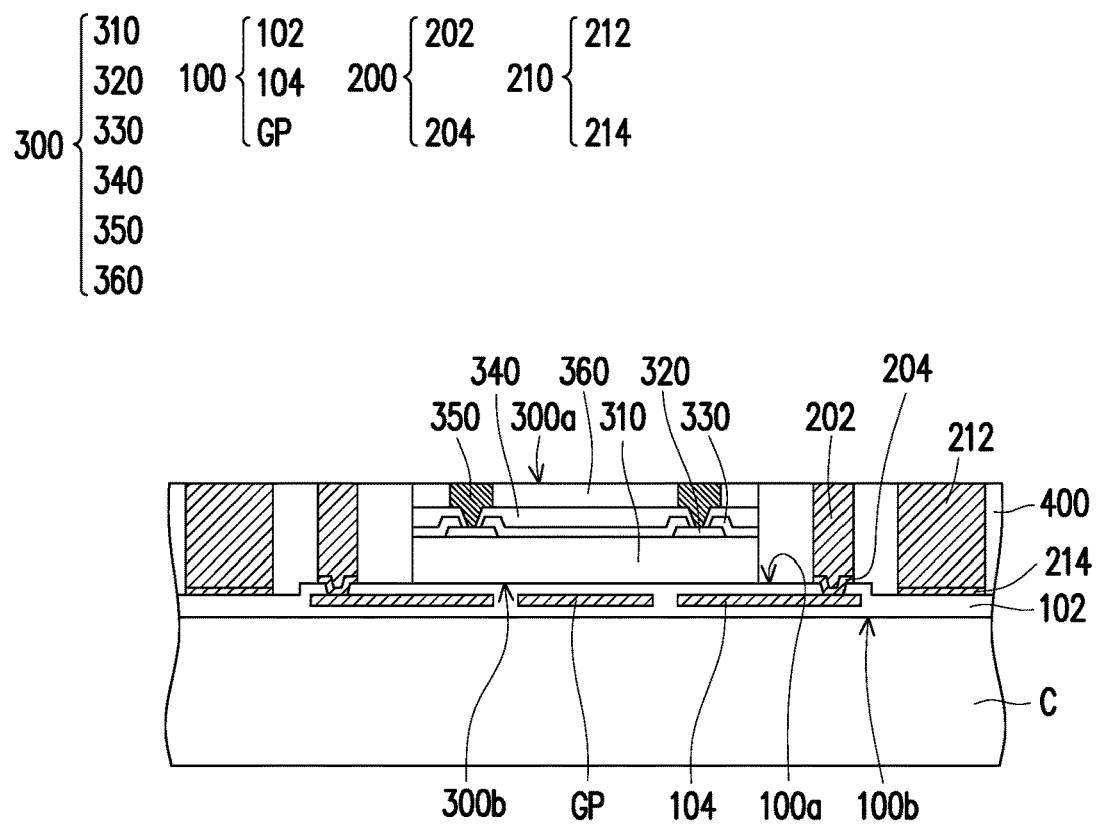

Referring to FIG. 1F, an encapsulant 400 is formed over the first surface 100a of the first redistribution structure 100 to encapsulate the die 300, the TIVs 200, and the antenna elements 210. In other words, the die 300, the TIVs 200, and the antenna elements 210 (dipole antennas 210') are embedded in the encapsulant 400. In some embodiments, the encapsulant 400 includes a molding compound, a molding underfill, a resin (such as epoxy), or the like. In some alternative embodiments, the encapsulant 400 includes a photo-sensitive material such as PBO, PI, BCB, a combination thereof, or the like. In some embodiments, a method of forming the encapsulant 400 includes the following steps. First, an encapsulation material (not shown) is formed on the first dielectric layer 102 through, for example, a compression molding process. The die 300, the TIVs 200, the antenna elements 210, the conductive vias 350, and the protection layer 360 are encapsulated by the encapsulation material. Thereafter, the encapsulation material is grinded until top surfaces of the conductive vias 350, top surfaces of the TIVs 200, and top surfaces of the antenna elements 210 are exposed, so as to form the encapsulant 400. In some embodiments, the encapsulant material is grinded by a mechanical grinding process and/or a chemical mechanical polishing (CMP) process. In some embodiments, during the grinding process of the encapsulant material, the protection layer 360 is grinded to reveal the conductive vias 350. In some embodiments, portions of the TIVs 200, portions of the antenna elements 210, and portions of the conductive vias 350 are slightly grinded also. After grinding, the die 300 has an active surface 300a and a rear surface 300b opposite to the active surface 300a. The exposed portion of the conductive vias 350 is located on the active surface 300a of the die 300. On the other hand, the ground plane GP and part of the first conductive patterns 104 are located over the rear surface 300b of the die 300.

Figure 1G:
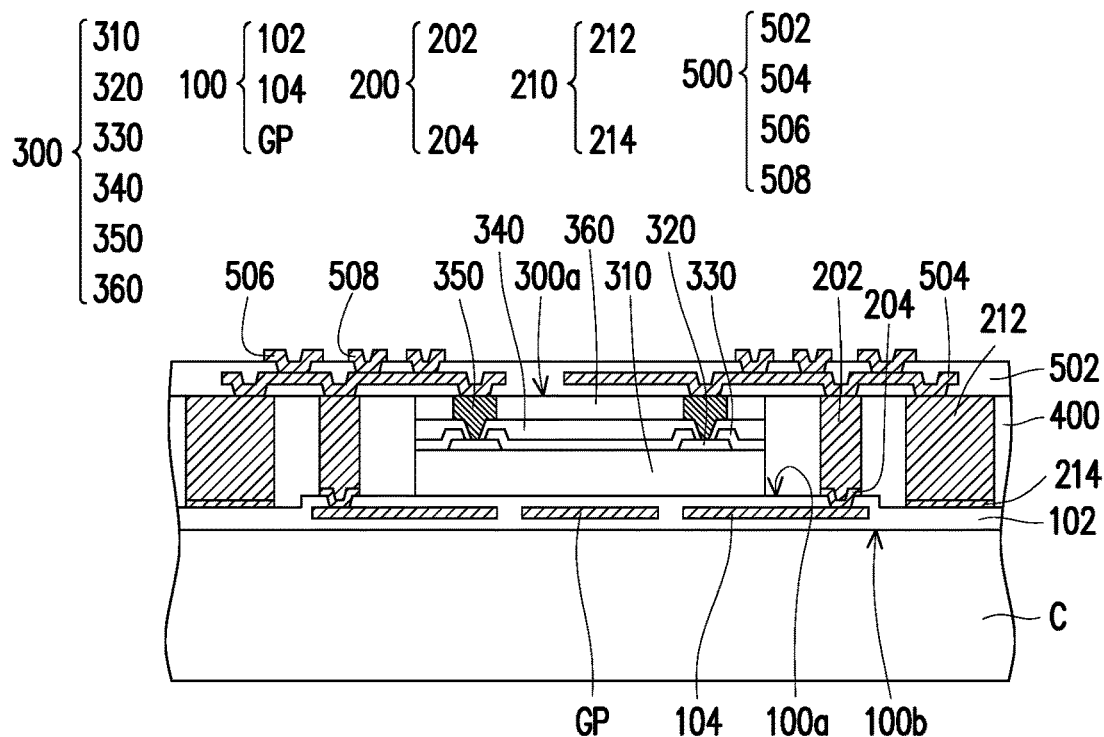

Referring to FIG. 1G, a second redistribution structure 500 is formed on the die 300, the TIVs 200, the antenna elements 210, and the encapsulant 400. As illustrated in FIG. 1G, the active surface 300a of the die 300 faces the second redistribution structure 500. In other words, the second redistribution structure 500 is disposed on the active surface 300a of the die 300. In some embodiments, the second redistribution structure 500 includes a second dielectric layer 502, a plurality of second conductive patterns 504, a plurality of under-ball metallurgy (UBM) patterns 506, and a plurality of connection pads 508. Similar to the first dielectric layer 102, the second dielectric layer 502 may also include multiple dielectric layers. A material of the second dielectric layer 502 is similar to that of the first dielectric layer 102, so the detailed description thereof is omitted herein. Similarly, the second conductive patterns 504, the UBM patterns 506, and the connection pads 508 may include the same material as that of the ground plane GP and the first conductive patterns 104, so the detailed descriptions thereof are also omitted herein. The second conductive patterns 504 are electrically connected to the conductive vias 350 of the die 300, the TIVs 200, and the antenna elements 210. In other words, the TIVs 200 electrically connect the first redistribution structure 100 and the second redistribution structure 500. On the other hand, the antenna elements 210 are electrically connected to the second redistribution structure 500. In some embodiments, the second conductive patterns 504, the UBM patterns 506, and the connection pads 508 may be collectively referred to as a second conductive pattern layer. The UBM patterns 506 and the connection pads 508 are the topmost conductive patterns in the second conductive pattern layer. For example, the UBM patterns 506 and the connection pads 508 may protrude from the second dielectric layer 502 for receiving subsequently formed component. As illustrated in FIG. 1G, the second redistribution structure 500 may be configured such that the dielectric layer (i.e. the dielectric layer(s) in the second dielectric layer 502) and the second conductive pattern layer (i.e. the second conductive patterns 504, the UBM patterns 506, and the connection pads 508) are stacked in an alternate manner. In some embodiments, the second redistribution structure 500 may be referred to as a front-side redistribution structure.

In some embodiments, the signal output from the die 300 may be transmitted through portions of the second conductive patterns 504, the TIVs 200, and the first conductive patterns 104 in sequential order. That is, in some embodiments, portions of the second conductive patterns 504, the TIVs 200, and the first conductive patterns 104 may be collectively referred to as a feed line. In some embodiments, the second redistribution structure 500 is electrically connected to the feed line. It should be noted that the number of the dielectric layers (the second dielectric layer 502) and/or the second conductive pattern layer (i.e. the second conductive patterns 504, the UBM patterns 506, and the connection pads 508) is not limited by the illustration presented in FIG. 1G. In some alternative embodiments, more dielectric layers and/or more conductive pattern layers may be formed to stack alternately.

Figure 1H:
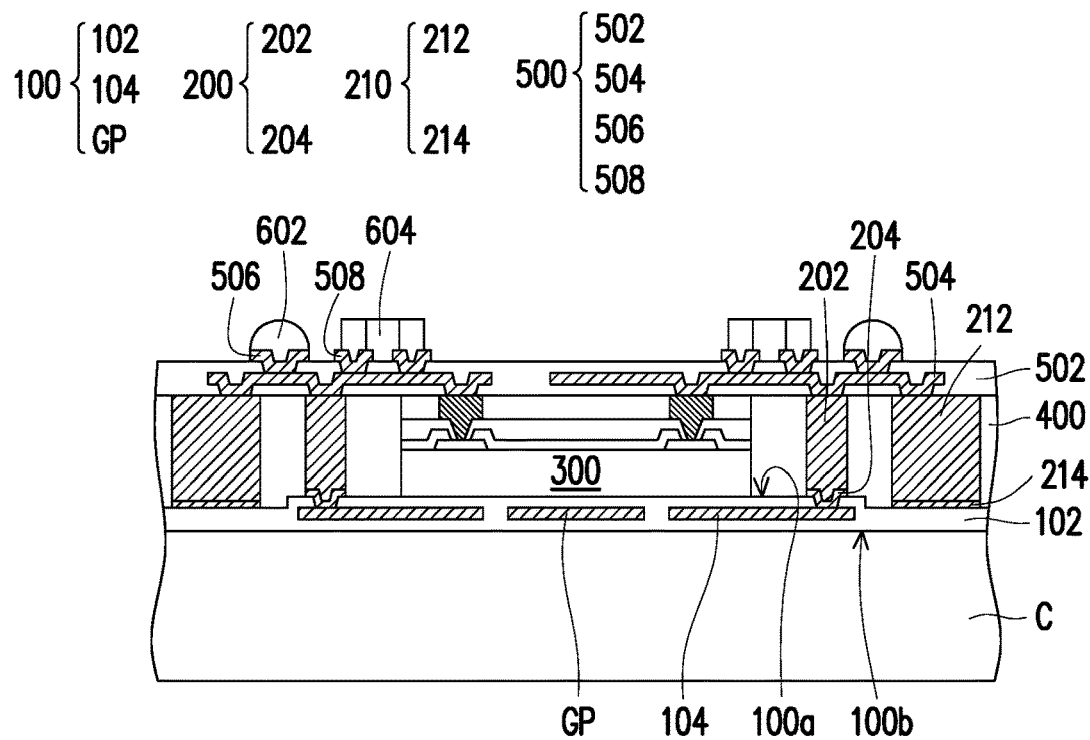

Referring to FIG. 1H, a plurality of conductive terminals 602 and a plurality of passive components 604 are formed on the second redistribution structure 500 opposite to the die 300. In some embodiments, the conductive terminals 602 are attached to the UBM patterns 506 through a solder flux (not shown). In some embodiments, the conductive terminals 600 are, for example, solder balls, ball grid array (BGA) balls, or C4 bumps. In some embodiments, the conductive terminals 602 are made of a conductive material with low resistivity, such as Sn, Pb, Ag, Cu, Ni, Bi, or an alloy thereof. In some embodiments, the conductive terminals 602 may be disposed on the UBM patterns 506 by a ball placement process and/or a reflow process. In some embodiments, the passive components 604 may be mounted on the connection pads 508 through a soldering process, a reflowing process, or other suitable processes. In some embodiments, the passive components 604 may include capacitors, resistors, inductors, fuses, or the like.

Figure 1I:
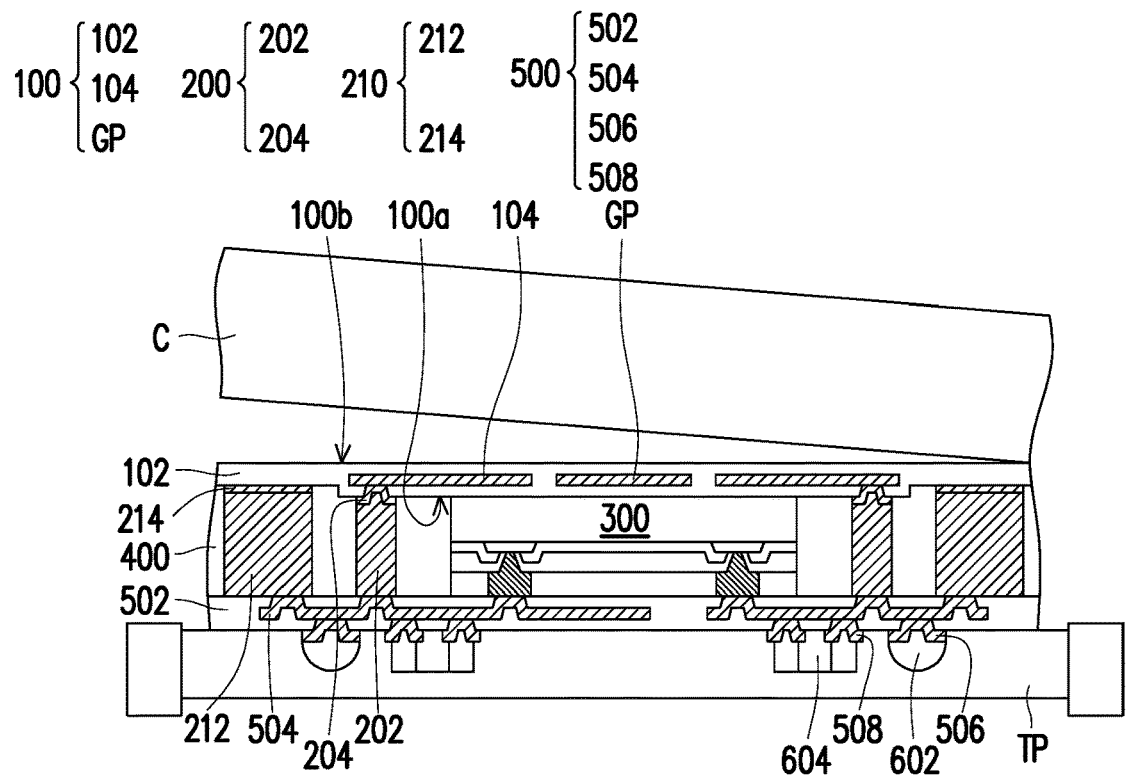

Referring to FIG. 1H and FIG. 1I, the structure illustrated in FIG. 1H is flipped upside down and is attached to a tape TP for further processing. Subsequently, the carrier C is removed. In some embodiments, the de-bonding layer (not shown) may be irradiated by an UV laser such that the first redistribution structure 100 is de-bonded from the carrier C.

Figure 1J:
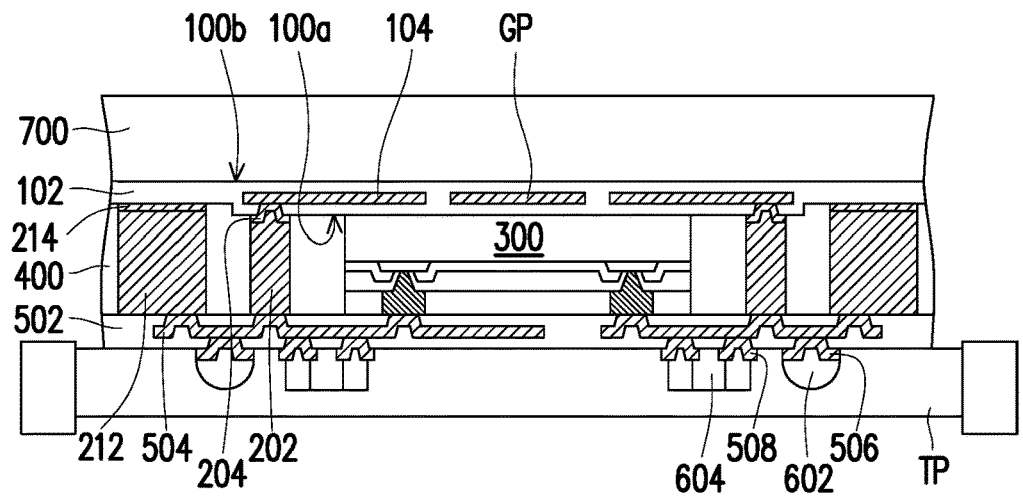

Referring to FIG. 1J, an insulating layer 700 is disposed on the first redistribution structure 100 opposite to the die 300. In some embodiments, the insulating layer 700 is a polymer layer. For example, the insulating layer 700 includes a photo-sensitive material such as PBO, polyimide, BCB, a combination thereof, or the like. In some alternative embodiments, the insulating layer 700 includes epoxy resins or any other suitable type of molding materials. In some embodiments, the material of the insulating layer 700 has a low dissipation factor (Df) and/or a low permittivity (Dk). Depending on the frequency range of high-speed applications, suitable materials of the insulating layer 700 may be selected based on the required electrical properties of the subsequently formed InFO package 10. The insulating layer 700 is formed by a suitable fabrication technique such as spin-coating, lamination, deposition or the like. In some embodiments, a thickness of the insulating layer 700 may range between 200 μm and 2 mm.

Figure 1K:
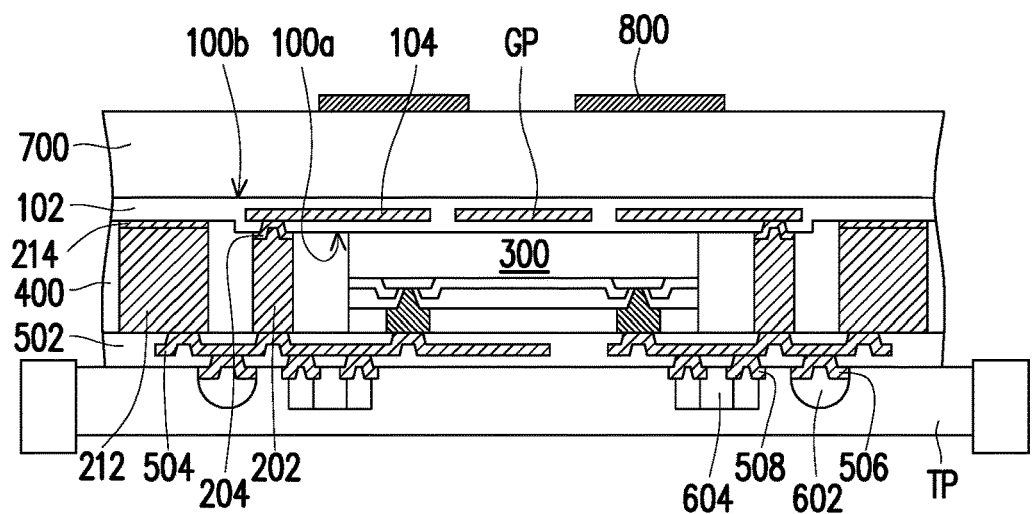

Referring to FIG. 1K, a plurality of conductive patches 800 is formed on the insulating layer 700. In some embodiments, a vertical projection of the conductive patches 800 onto the first redistribution structure 100 in the thickness direction of the insulating layer 700 is partially overlapped with the ground plane GP. In some embodiments, the conductive patches 800 are formed by forming a metallization layer (not shown) through electroplating or deposition over the insulating layer 700 and then patterning the metallization layer by a photolithography and etching processes. In some alternative embodiments, the conductive patches 800 may be formed by printing a plurality of metallization patterns directly onto the insulating layer 700. For example, metallic paste may be printed onto the insulating layer 700 and cured to form the conductive patches 800. In some embodiments, a material of the conductive patches 800 includes aluminum, titanium, copper, nickel, tungsten, and/or alloys thereof. In some embodiments, the conductive patches 800 may be electrically coupled to the first conductive patterns 104 (portions of the feed line) of the first redistribution structure 100. In other words, the signal transmitted in the first conductive patterns 104 may be electrically coupled to the conductive patches 800 such that the conductive patches 800 may be referred to as patch antennas. It should be noted that in some embodiments, formation of the insulating layer 700 and the conductive patches 800 may be optional.

Figure 1L:
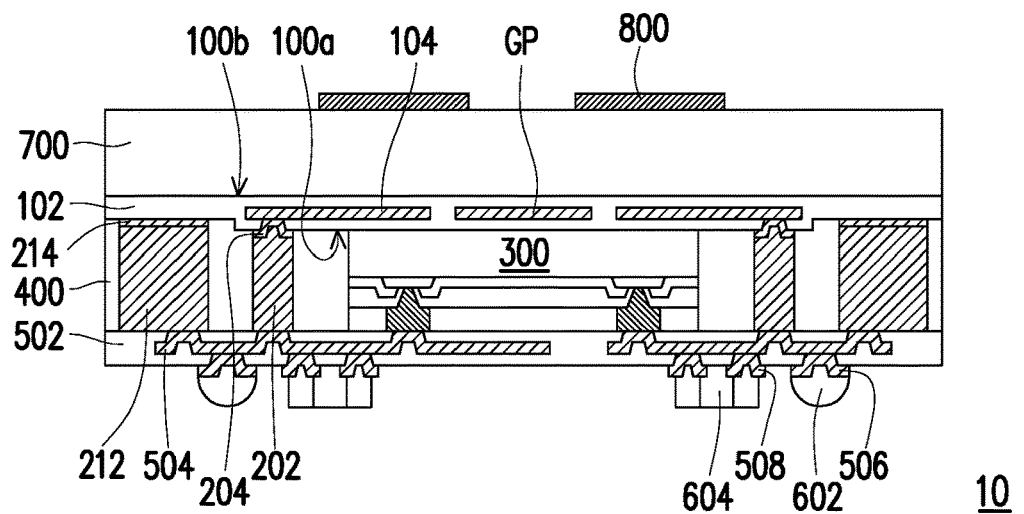

Referring to FIG. 1K and FIG. 1L, the tape TP is removed and the structure illustrated in FIG. 1K may undergo a singulation process to form the InFO package 10 illustrated in FIG. 1L.

Figure 4:
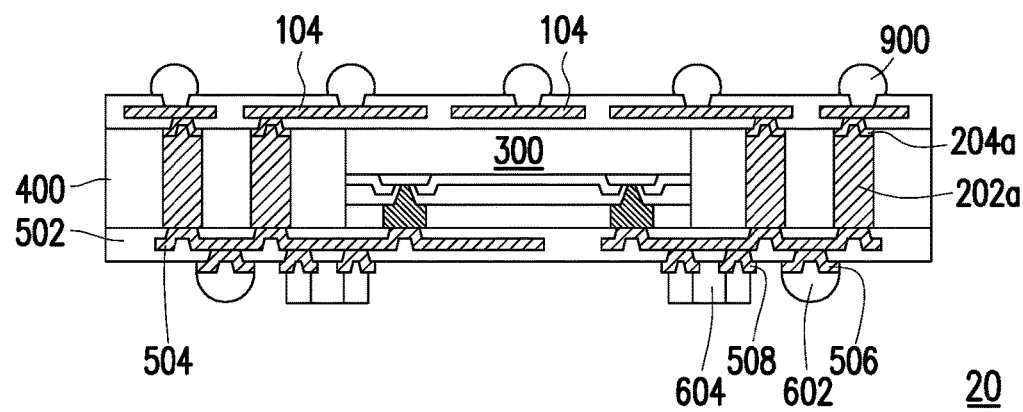
FIG. 4 is a schematic cross-sectional view illustrating an integrated fan-out (InFO) package in accordance with some embodiments of the disclosure.

FIG. 4 is a schematic cross-sectional view illustrating an integrated fan-out (InFO) package 20 in accordance with some embodiments of the disclosure. Referring to FIG. 4, the InFO package 20 in FIG. 4 is similar to the structure in FIG. 1I, so similar components are denoted by similar reference numerals, and the detailed descriptions thereof are omitted herein. The difference between the InFO package 20 in FIG. 4 and the structure in FIG. 1I lies in that the antenna elements and the ground plane are omitted in the InFO package 20. In addition, the InFO package 20 further includes a plurality of conductive terminals 900 disposed on the first redistribution structure 100 opposite to the die 300. In some embodiments, the conductive terminals 900 are directly in contact with the first conductive patterns 104 to render electrical connection with the first redistribution structure 100. In some embodiments, the conductive terminals 900 are, for example, solder balls, ball grid array (BGA) balls, or C4 bumps. In some embodiments, the conductive terminals 900 are made of a conductive material with low resistivity, such as Sn, Pb, Ag, Cu, Ni, Bi, or an alloy thereof. In some embodiments, the conductive terminals 900 may be formed through a ball placement process and/or a reflow process.

In some embodiments, the InFO package 20 includes a plurality of TIVs 200a disposed on the first redistribution structure 100 and the second redistribution structure 500. In some embodiments, the first redistribution structure 100 is electrically connected to the second redistribution structure 500 through the TIVs 200a. In some embodiments, the TIVs 200a are embedded in the encapsulant 400. In some embodiments, each TIV 200a includes a conductive material layer 202a and a seed layer pattern 204a stacked on the conductive material layer 202a. In some embodiments, the TIVs 200a are formed to surround the die 300. The relative configuration of the TIVs 200a and the die 300 will be discussed below in conjunction with FIG. 5A.

Figure 5A:
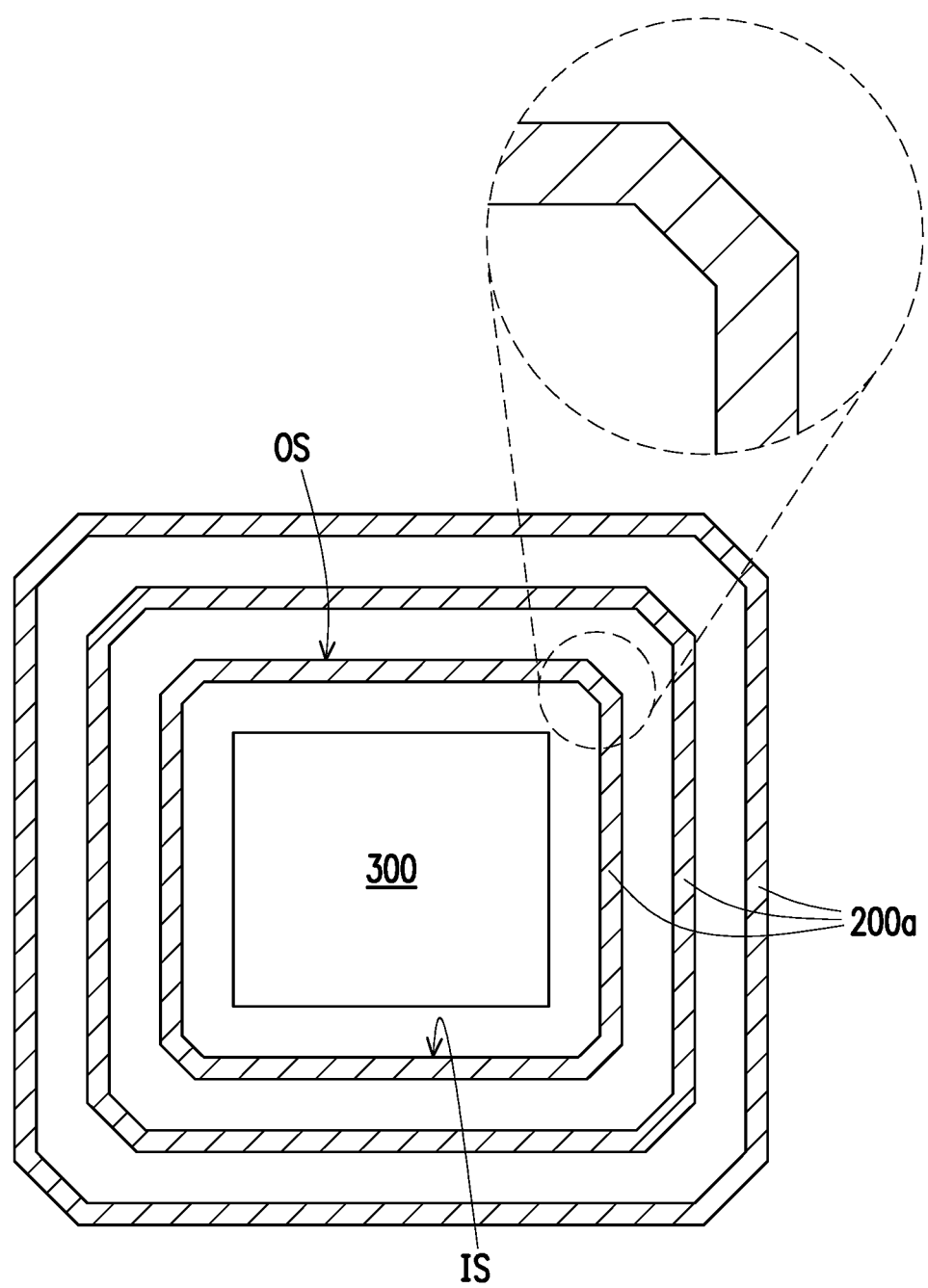
FIG. 5A is a schematic top view illustrating a portion of the InFO package in accordance with some embodiments of the disclosure.

FIG. 5A is a schematic top view illustrating a portion of the InFO package 20 in accordance with some embodiments of the disclosure. For simplicity, components other than the TIVs 200a and the die 300 are not shown in FIG. 5A. Referring to FIG. 5A, the TIVs 200a are loop-shaped. For example, each loop-shaped TIV 200a surrounds four sides of the die 300. In some embodiments, the loop-shaped TIVs 200a may be adapted for wireless applications. In some embodiments, each loop-shaped TIV 200a has an inner sidewall IS and an outer sidewall OS opposite to the inner sidewall IS. In some embodiments, the inner sidewall IS faces toward the die 300 while the outer sidewall OS faces away from the die 300. As illustrated in FIG. 5A, the inner sidewall IS and the outer sidewall OS are free of sharp corner. For example, the portion of the inner sidewall IS facing four corners of the die 300 has similar profile as that of the third sub-sidewall FS13 and/or the fourth sub-sidewall FS14 in FIG. 3A to FIG. 3C. On the other hand, the portion of the outer sidewall OS corresponding to four corners of the die 300 has similar profile as that of the third sub-sidewall FS23 in FIG. 3A, FIG. 3B, and FIG. 3D. Since the inner sidewall IS and the outer sidewall OS are free of sharp corner, the photoresist layer PR (shown in FIG. 1B and FIG. 2) may be effectively removed during the photolithography process for forming the TIVs 200a. As a result, the negative effects originated from undercut of the photoresist layer PR may be sufficiently eliminated, thereby ensuring the performance of the InFO package 20.

It should be noted that the configuration shown in FIG. 5A is merely an exemplary illustration, and the disclosure is not limited thereto. Other configurations of the TIVs 200a will be discussed below in conjunction with FIG. 5B.

Figure 5B:
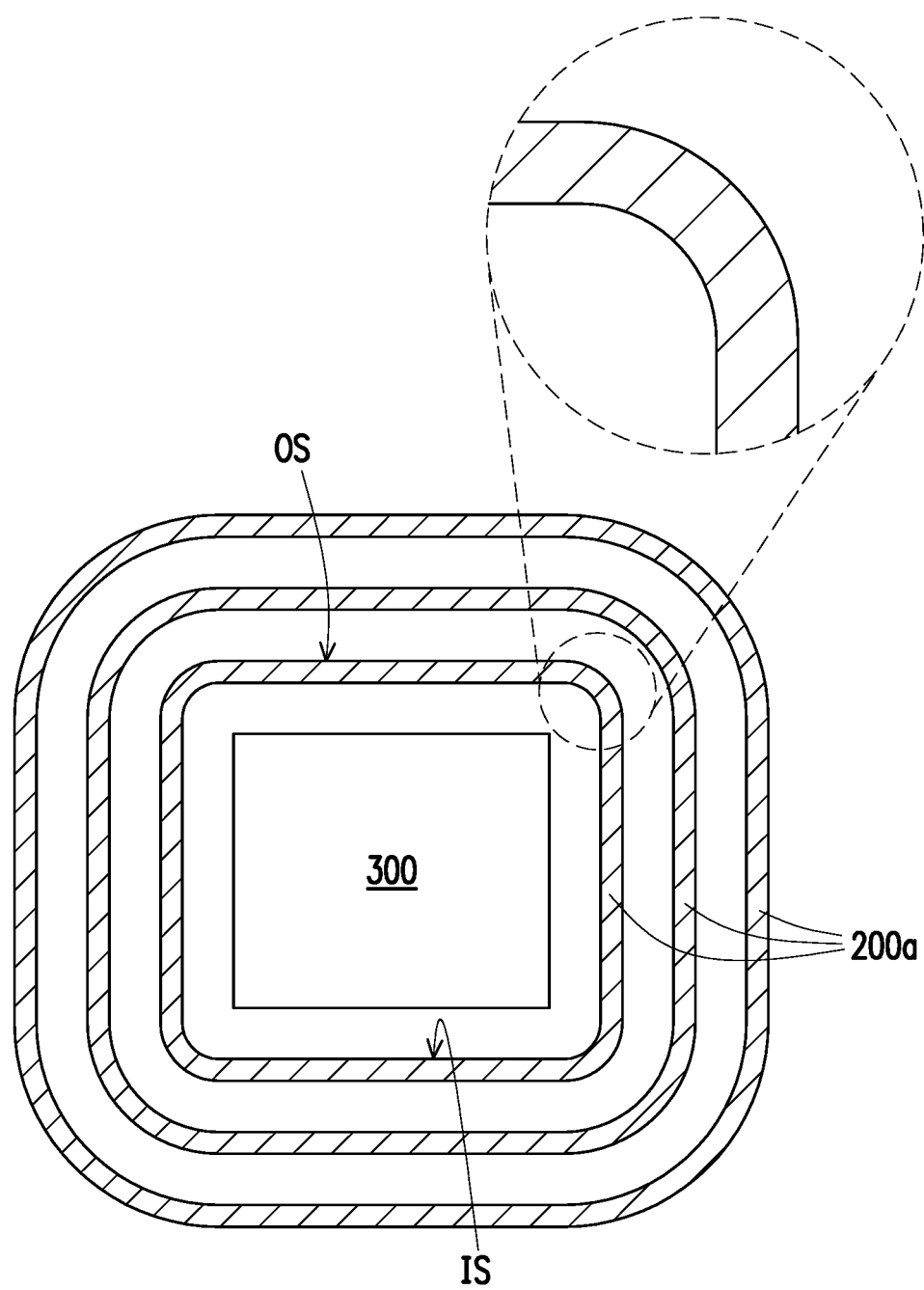
FIG. 5B is a schematic top view illustrating a portion of the InFO package in accordance with some alternative embodiments of the disclosure.

FIG. 5B is a schematic top view illustrating a portion of the InFO package 20 in accordance with some alternative embodiments of the disclosure. For simplicity, components other than the TIVs 200a and the die 300 are now shown in FIG. 5B. Referring to FIG. 5B, the loop-shaped TIVs 200a surround four sides of the die 300. In some embodiments, each loop-shaped TIV 200a has an inner sidewall IS and an outer sidewall OS opposite to the inner sidewall IS. In some embodiments, the inner sidewall IS faces toward the die 300 while the outer sidewall OS faces away from the die 300. As illustrated in FIG. 5B, the inner sidewall IS and the outer sidewall OS have round corners. In some embodiments, the portion of the inner sidewall IS facing four corners of the die 300 has a curved profile. For example, the portion of the inner sidewall IS facing four corners of the die 300 has similar profile as that of the third sub-sidewall FS13 in FIG. 3D and FIG. 3E. On the other hand, the portion of the outer sidewall OS corresponding to four corners of the die 300 has similar profile as that of the third sub-sidewall FS23 in FIG. 3C and FIG. 3E. Since the inner sidewall IS and the outer sidewall OS are free of sharp corner, the photoresist layer PR (shown in FIG. 1B and FIG. 2) may be effectively removed during the photolithography process for forming the TIVs 200a. As a result, the negative effects originated from undercut of the photoresist layer PR may be sufficiently eliminated, thereby ensuring the performance of the InFO package 20.

In accordance with some embodiments of the disclosure, an integrated fan-out (InFO) package includes a first redistribution structure, a die, an encapsulant, a plurality of through insulating vias (TIV), a plurality of dipole antennas, and a second redistribution structure. The die is disposed on the first redistribution structure. The encapsulant encapsulates the die. The TIVs and the dipole antennas are embedded in the encapsulant. Each dipole antenna includes a pair of antenna elements. Each antenna element has a first folded-sidewall and a second folded-sidewall opposite to the first folded-sidewall. A portion of each second folded-sidewall in the pair of antenna elements face each other. Each first folded-sidewall includes at least three sub-sidewalls connected to each other. The adjacent sub-sidewalls form an obtuse angle. The second redistribution structure is disposed on the die, the TIVs, the dipole antennas, and the encapsulant.

In accordance with some alternative embodiments of the disclosure, an integrated fan-out (InFO) package includes a first redistribution structure, a die, an encapsulant, a plurality of through insulating vias (TIV), a plurality of dipole antennas, and a second redistribution structure. The die is disposed on the first redistribution structure. The encapsulant encapsulates the die. The TIVs and dipole antenna are embedded in the encapsulant. Each dipole antenna includes a pair of antenna elements. Each antenna element has a first folded-sidewall and a second folded-sidewall opposite to the first folded-sidewall. A portion of each second folded-sidewall in the pair of antenna elements face each other. Each first folded-sidewall includes a first sub-sidewall, a second sub-sidewall, and a third sub-sidewall connecting the first sub-sidewall and the second sub-sidewall. The third sub-sidewall is a curved sidewall. The second redistribution structure is disposed on the die, the TIVs, the dipole antennas, and the encapsulant.

In accordance with some alternative embodiments of the disclosure, an integrated fan-out (InFO) package includes a first redistribution structure, a die, a plurality of loop-shaped through insulating vias (TIV), an encapsulant, and a second redistribution structure. The die is disposed on the first redistribution structure. The loop-shaped TIVs are disposed on the first redistribution structure. Each loop-shaped TIV surrounds four sides of the die. Each loop-shaped TIV has an inner sidewall facing the die. The inner sidewall facing four corners of the die has a curved profile. The encapsulant encapsulates the die and the loop-shaped TIVs. The second redistribution structure is disposed on the die, the loop-shaped TIVs, and the encapsulant. The first redistribution structure is electrically connected to the second redistribution structure through the loop-shaped TIVs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out (InFO) package, comprising:
a first redistribution structure;
a die disposed on the first redistribution structure;
an encapsulant encapsulating the die;
a plurality of through insulating vias (TIV) and a plurality of dipole antennas embedded in the encapsulant, wherein each dipole antenna comprises a pair of antenna elements, each antenna element has a first folded-sidewall and a second folded-sidewall opposite to the first folded-sidewall, a portion of each second folded-sidewall in the pair of antenna elements face each other, each first folded-sidewall comprises at least three sub-sidewalls connected to each other, and the adjacent sub-sidewalls form an obtuse angle; and
a second redistribution structure disposed on the die, the plurality of TIVs, the plurality of dipole antennas, and the encapsulant.

2. The InFO package according to claim 1, further comprising:
an insulating layer disposed on the first redistribution structure opposite to the die; and
a plurality of conductive patches on the insulating layer.

3. The InFO package according to claim 1, further comprising a plurality of conductive terminals and a plurality of passive components on the second redistribution structure opposite to the die.

4. The InFO package according to claim 1, wherein each second folded-sidewall comprises at least three sub-sidewalls connected to each other, and the adjacent sub-sidewalls of the second folded-sidewall form an obtuse angle.

5. The InFO package according to claim 4, wherein two sub-sidewalls of the second folded-sidewall farthest away from each other are perpendicular.

6. The InFO package according to claim 1, wherein the second folded-sidewall comprises a first sub-sidewall, a second sub-sidewall, and a third sub-sidewall connecting the first sub-sidewall and the second sub-sidewall, and the third sub-sidewall is a curved sidewall.

7. The InFO package according to claim 1, wherein each antenna element comprises a protrusion protruding from the second folded-sidewall and a rounded corner connecting the second folded-sidewall and the protrusion.

8. The InFO package according to claim 1, wherein two sub-sidewalls of the first folded sidewall farthest away from each other are perpendicular.

9. The InFO package according to claim 1, wherein the plurality of TIVs are arranged between the die and the plurality of dipole antennas.

10. An integrated fan-out (InFO) package, comprising:
a first redistribution structure;
a die disposed on the first redistribution structure;
an encapsulant encapsulating the die;
a plurality of through insulating vias (TIV) and a plurality of dipole antennas embedded in the encapsulant, wherein each dipole antenna comprises a pair of antenna elements, each antenna element has a first folded-sidewall and a second folded-sidewall opposite to the first folded-sidewall, a portion of each second folded-sidewall in the pair of antenna elements face each other, each first folded-sidewall comprises a first sub-sidewall, a second sub-sidewall, and a third sub-sidewall connecting the first sub-sidewall and the second sub-sidewall, and the third sub-sidewall is a curved sidewall;
a second redistribution structure disposed on the die, the plurality of TIVs, the plurality of dipole antennas, and the encapsulant.

11. The InFO package according to claim 10, further comprising:
an insulating layer disposed on the first redistribution structure opposite to the die; and
a plurality of conductive patches on the insulating layer.

12. The InFO package according to claim 10, further comprising a plurality of conductive terminals and a plurality of passive components on the second redistribution structure opposite to the die.

13. The InFO package according to claim 10, wherein each second folded-sidewall comprises at least three sub-sidewalls connected to each other, and the adjacent sub-sidewalls of the second folded-sidewall form an obtuse angle.

14. The InFO package according to claim 13, wherein two sub-sidewalls of the second folded sidewall farthest away from each other are perpendicular.

15. The InFO package according to claim 10, wherein the second folded-sidewall comprises a first sub-sidewall, a second sub-sidewall, and a third sub-sidewall connecting the first sub-sidewall and the second sub-sidewall, and the third sub-sidewall of the second folded sidewall is a curved sidewall.

16. The InFO package according to claim 10, wherein each antenna element comprises a protrusion protruding from the second folded-sidewall and a rounded corner connecting the second folded-sidewall and the protrusion.

17. The InFO package according to claim 10, wherein the first sub-sidewall and the second sub-sidewall are perpendicular to each other.

18. The InFO package according to claim 10, wherein the plurality of TIVs are arranged between the die and the plurality of dipole antennas.

19. An integrated fan-out (InFO) package, comprising:
a first redistribution structure;
a die disposed on the first redistribution structure;
an encapsulant encapsulating the die;
a plurality of dipole antennas embedded in the encapsulant, wherein each dipole antenna comprises a pair of antenna elements, each antenna element has a first folded-sidewall and a second folded-sidewall opposite to the first folded-sidewall, each first folded-sidewall has a first set of sub-sidewalls, each second folded-sidewall has a second set of sub-sidewalls, and a number of the sub-sidewalls in the first set of sub-sidewalls is different from a number of the sub-sidewalls in the second set of sub-sidewalls; and
a second redistribution structure disposed on the die, the plurality of dipole antennas, and the encapsulant.

20. The InFO package according to claim 19, wherein a portion of each second folded-sidewall in the pair of antenna elements face each other, and the number of the sub-sidewalls in the first set of sub-sidewalls is greater than the number of the sub-sidewalls in the second set of sub-sidewalls.

* * * * *